United States Patent
Smith et al.

(10) Patent No.: US 6,873,543 B2
(45) Date of Patent: Mar. 29, 2005

(54) MEMORY DEVICE

(75) Inventors: Kenneth Kay Smith, Boise, ID (US); Andrew VanBrocklin, Corvallis, OR (US); Peter Fricke, Corvallis, OR (US); Frederick A. Perner, Palo Alto, CA (US); Kenneth James Eldredge, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 130 days.

(21) Appl. No.: 10/448,574

(22) Filed: May 30, 2003

(65) Prior Publication Data

US 2004/0240255 A1 Dec. 2, 2004

(51) Int. Cl.[7] .................... G11C 11/00; G11C 11/14; G11C 11/15
(52) U.S. Cl. .................... 365/158; 365/171; 365/173
(58) Field of Search ................ 365/158, 171, 365/173

(56) References Cited

U.S. PATENT DOCUMENTS

| | | | |
|---|---|---|---|
| 3,577,134 A | * 5/1971 | Bergman | 365/171 |
| 4,075,612 A | * 2/1978 | Johnson et al. | 365/171 |
| 4,841,480 A | * 6/1989 | Lampe et al. | 365/158 |
| 5,936,892 A | 8/1999 | Wendell | |
| 6,147,900 A | * 11/2000 | Pohm | 365/158 |
| 6,259,644 B1 | 7/2001 | Tran et al. | |
| 6,262,625 B1 | 7/2001 | Perner et al. | |
| 6,275,411 B1 | * 8/2001 | Daughton et al. | 365/158 |
| 6,314,039 B1 | 11/2001 | Hill et al. | |
| 6,317,375 B1 | 11/2001 | Perner | |
| 6,324,093 B1 | 11/2001 | Perner et al. | |
| 6,384,664 B1 | 5/2002 | Hellums et al. | |
| 6,385,111 B2 | 5/2002 | Tran et al. | |
| 6,504,779 B2 | 1/2003 | Perner | |
| 6,633,497 B2 | * 10/2003 | Nickel | 365/158 |
| 6,727,105 B1 | * 4/2004 | Brug et al. | 365/158 |
| 6,816,405 B1 | * 11/2004 | Lu et al. | 365/171 |
| 6,826,077 B2 | * 11/2004 | Smith et al. | 365/173 |
| 6,826,079 B2 | * 11/2004 | Tran | 365/171 |
| 6,826,094 B1 | * 11/2004 | Perner et al. | 365/171 |

* cited by examiner

Primary Examiner—Trong Phan

(57) ABSTRACT

Embodiments of the present invention provide a memory device. In one embodiment, the memory device comprises an array of memory cells configured to provide resistive states, a read circuit configured to sense the resistive states and a resistor. The resistor is configured to provide a resistance to the read circuit that is configured to select the resistor and sense the resistance to test the read circuit.

33 Claims, 4 Drawing Sheets

MEMORY DEVICE

BACKGROUND OF THE INVENTION

Non-volatile memory devices include memory cells that have at least two stable states. In some non-volatile memory devices, each state has a different resistance characteristic such that the resistance through the memory cell differs based on the state of the memory cell. The resistance through the memory cell is higher in one state relative to the resistance through the memory cell in another state. These memory devices can be reprogrammable or one-time programmable devices.

One type of reprogrammable non-volatile memory known in the art relies on magnetic memory cells. These devices, known as magnetic random access memory (MRAM) devices, include an array of magnetic memory cells. The magnetic memory cells may be of different types. For example, a magnetic tunnel junction (MTJ) memory cell or a giant magnetoresistive (GMR) memory cell.

Generally, the magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer and the magnetic film that is fixed is referred to as a reference layer or pinned layer. In an MTJ memory cell, a barrier layer separates the sense layer and the reference layer.

Conductive traces referred to as word lines and bit lines are routed across the array of memory cells. Word lines extend along rows of the memory cells, and bit lines extend along columns of the memory cells. A memory cell stores a bit of information as an orientation of magnetization in a sense layer at each intersection of a word line and a bit line. The orientation of magnetization in the sense layer aligns along an axis of the sense layer referred to as its easy axis. The orientation of magnetization does not easily align along an axis orthogonal to the easy axis, referred to as the hard axis. Magnetic fields are applied to flip the orientation of magnetization in the sense layer along its easy axis to either a parallel or anti-parallel orientation with respect to the orientation of magnetization in the reference layer.

In one configuration, the word lines and bit lines are routed across the array of memory cells to aid in flipping the orientation of magnetization in sense layers. The bit lines extend along columns of memory cells near the reference layers. The word lines extend along rows of memory cells near the sense layers. The word lines and bit lines are electrically coupled to a write circuit.

During a write operation, the write circuit selects one word line and one bit line to change the orientation of magnetization in the sense layer of the memory cell situated at the conductors crossing point. The write circuit supplies write currents to the selected word line and bit line to create magnetic fields in the selected memory cell. These write currents may be the same or different in magnitude. The magnetic fields combine to switch the orientation of magnetization in the selected memory cell from parallel to anti-parallel or vice-versa.

The resistance through a memory cell differs according to the parallel or anti-parallel orientation of magnetization of the sense layer and the reference layer. The resistance is highest when the orientation is anti-parallel, which can be referred to as the logic "1" state, and lowest when the orientation is parallel, which can be referred to as the logic "0" state. The resistive state of the memory cell can be determined by sensing the resistance through the memory cell.

Word lines and bit lines aid in sensing the resistance through a memory cell. Word lines, which extend along rows, are electrically coupled to sense layers, and bit lines, which extend along columns, are electrically coupled to reference layers. Word lines and bit lines are also electrically coupled to a read circuit.

During a read operation, the read circuit selects one word line and one bit line to sense the resistance of the memory cell situated at the conductors crossing point. The read circuit can supply a voltage across the selected memory cell and provide a sense current through the memory cell. The sense current is proportional to the resistance through the memory cell. In one configuration, the sense current is compared to a reference current to determine the state of the memory cell. The reference current is used to differentiate a high resistive state from a low resistive state.

Although generally reliable, failures can occur that affect the ability of the memory device to store data reliably. These failures include memory cell failures and sensing failures related to the read circuits. Memory cell failures and sensing failures can result from causes including manufacturing imperfections, process variations and aging of the memory device.

The memory device is tested to determine whether the read circuits and memory cells are functioning properly. The read circuits can be tested using memory cells as test resistance values. However, memory cells are not always adequate for testing read circuits.

The resistance through a memory cell differs from cell to cell in the same array and from memory device to memory device. In an MTJ memory cell, the resistance through the memory cell is dependent on the barrier layer thickness. The barrier layer is a very thin insulating layer between the sense layer and the reference layer. The barrier layer may be aluminum oxide and angstroms thick. The resistance of the memory cell varies exponentially with the thickness of the barrier layer. A change in barrier layer thickness of only 2% can change the resistance through the memory cell by a factor of 2. Even with tight controls, the resistance through memory cells can differ greatly from cell to cell and from memory device to memory device. For this reason, memory cells do not consistently provide adequate test resistance values.

SUMMARY OF THE INVENTION

Embodiments of the present invention provide a memory device. In one embodiment, the memory device comprises an array of memory cells configured to provide resistive states, a read circuit configured to sense the resistive states and a resistor. The resistor is configured to provide a resistance to the read circuit that is configured to select the resistor and sense the resistance to test the read circuit.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
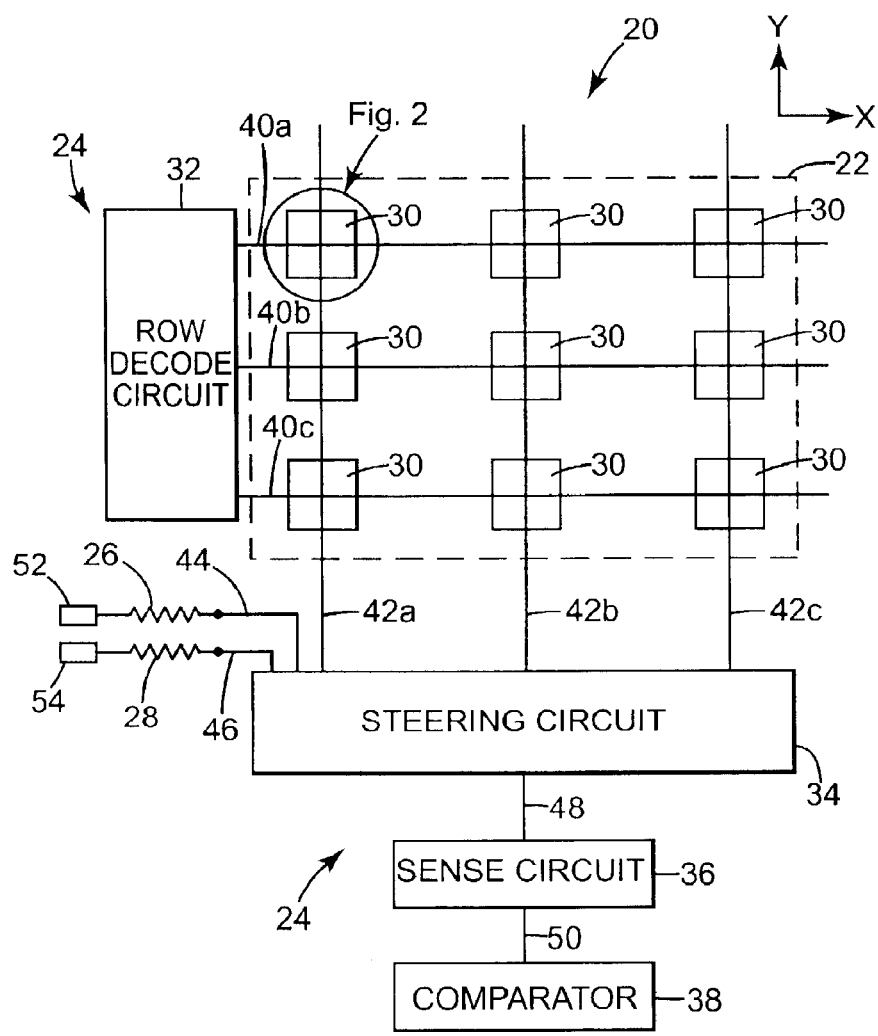
FIG. 1 is a diagram illustrating an exemplary embodiment of a memory device, according to the present invention.

FIG. 1 is a diagram illustrating an exemplary embodiment of a memory device 20, according to the present invention. The memory device 20 includes a memory cell array 22, a read circuit 24, a write circuit (not shown for clarity), a first resistor 26 and a second resistor 28. The memory cell array 22 is a magnetic memory cell array including magnetic memory cells 30. The array 22 is electrically coupled to the read circuit 24 and the write circuit. The first and second resistors 26 and 28 are electrically coupled to the read circuit 24.

The first and second resistors 26 and 28 provide test resistance values to the read circuit 24. The first and second resistors 26 and 28 are made from material that provides consistent resistance values from device to device. The resistors 26 and 28 are not magnetic memory cells, such as magnetic memory cells 30. In one embodiment, the resistors 26 and 28 are N well diffusion resistors, which can be produced during the same CMOS process that produces the rest of memory device 20. In another embodiment, the resistors 26 and 28 are undoped polysilicon resistors, which can also be produced during the same CMOS process that produces the rest of memory device 20. In other embodiments, the resistors 26 and 28 can be doped polysilicon resistors or tunable resistors. The tunable resistors include annealed resistors, laser trimmed resistors and configurable resistor arrays. In each of these embodiments, the resistors 26 and 28 are part of the integrated circuit chip including array 22, read circuit 24 and the write circuit. In an alternative embodiment, the resistors 26 and 28 are provided as separate components, which are not part of the integrated circuit chip including array 22. In this embodiment, the resistors 26 and 28 can be high precision resistors, such as 1% resistors and metal thin film resistors.

Test patterns are provided to test different aspects of the read circuit 24. In one test pattern, a digital waveform test pattern including a fixed magnitude voltage and various duty cycles is provided to test functionality. In another test pattern, a ramped waveform is provided to test the dynamic response of the read circuit 24.

The first and second resistors 26 and 28 also provide calibration and reference resistance values to read circuit 24. During calibration of read circuit 24, a voltage source provides a stable calibration voltage signal to provide a stable calibration current signal. To obtain reference values, a voltage source provides a stable reference voltage signal to provide a stable reference current signal.

The memory cells 30 in array 22 are arranged in rows and columns, with the rows extending along an x-direction and the columns extending along a y-direction. Only a relatively small number of memory cells 30 are shown to simplify the illustration of the memory device 20. In other embodiments, arrays of any suitable size can be used.

In the exemplary embodiment, the read circuit 24 includes a row decode circuit 32, a steering circuit 34, a sense circuit 36 and a comparator circuit 38. The row decode circuit 32 is electrically coupled to word lines 40a–40c, and steering circuit 34 is electrically coupled to bit lines 42a–42c. The conductive word lines 40a–40c extend along the x-direction in a plane on one side of array 22, and the conductive bit lines 42a–42c extend along the y-direction in a plane on an opposing side of array 22. There is one word line 40 for each row of the array 22, and one bit line 42 for each column of the array 22. A memory cell 30 is located at each cross-point of a word line 40 and a bit line 42.

The steering circuit 34 is electrically coupled to first resistor 26 through a first resistor conductor 44, and to second resistor 28 through a second resistor conductor 46. In addition, the steering circuit 34 is electrically coupled to sense circuit 36 through sense conductor 48. The sense circuit 36 is electrically coupled to the steering circuit 34 through sense conductor 48, and to comparator 38 through comparator conductor 50. The first resistor 26 is electrically coupled to a first voltage source, indicated at 52, and the second resistor 28 is electrically coupled to a second voltage source, indicated at 54. In the exemplary embodiment, only one read circuit 24 and one set of first and second resistors 26 and 28 are shown. In other embodiments, any suitable number of read circuits 24, and first and second resistors 26 and 28 can be included.

In the exemplary embodiment, the write circuit (not shown) is electrically coupled to word lines 40a–40c and bit lines 42a–42c. The write circuit is configured to provide a first write current through a selected word line 40a–40c in either direction, and a second write current through a selected bit line 42a–42c in either direction. A memory cell 30 is located at each cross-point of a word line 40 and a bit line 42.

During a write operation, the write circuit selects one word line 40a–40c and one bit line 42a–42c to set or switch the orientation of magnetization in the sense layer of the memory cell 30 located at the cross-point. The write circuit provides the first write current to the selected word line 40a–40c and the second write current to the selected bit line 42a–42c. The first write current creates a magnetic field around the selected word line 40a–40c, according to the right hand rule, and the second write current creates a magnetic field around the selected bit line 42a–42c, according to the right hand rule. These magnetic fields combine to set or switch the orientation of magnetization in the sense layer of the selected memory cell 30.

During a read operation, read circuit 24 selects one word line 40a–40c and one bit line 42a–42c to sense the resistance through the memory cell 30 located at the cross-point of the selected word line 40a–40c and bit line 42a–42c. The row decode circuit 32 is controlled to select a word line 40a–40c, and the steering circuit 34 is controlled to select a bit line 42a–42c. The steering circuit 34 electrically couples the selected bit line 42a–42c to sense conductor 48 and sense circuit 36. The row decode circuit 32 provides a voltage on the selected word line 40a–40c to produce a sense current through the selected memory cell 30. The sense current is provided to the selected bit line 42a–42c and steering circuit 34. The steering circuit 34 provides the sense current to sense circuit 36. The sense circuit 36 senses the magnitude of the sense current and provides an output signal to comparator 38. The magnitude of the output signal indicates the resistive state of the selected memory cell 30. The output of comparator 38 is a high or low logic level indicating the resistive state of the selected memory cell 30.

To test read circuit 24, steering circuit 34 is controlled to select first resistor 26 and second resistor 28. In one embodiment, first resistor 26 has a resistance value, which is close to the expected low resistance value of memory cells 30 in array 22. The second resistor 28 has a resistance value, which is close to the expected high resistance value of memory cells 30 in array 22.

The steering circuit 34 selects first resistor 26 and couples first resistor 26 to sense circuit 36. First voltage source 52 provides test patterns to first resistor 26. The output of comparator 38 is compared to expected results to determine the operational status of read circuit 24 and sense circuit 36. Selecting first resistor 26 tests read circuit 24 and sense circuit 36 at a resistance value, which is close to the expected low resistance value of memory cells in array 22.

Next, steering circuit 34 is controlled to select second resistor 28 and couple second resistor 28 to sense circuit 36. The second voltage source 54 provides test patterns to second resistor 28. The sense circuit 36 provides an output signal to comparator 38. The comparator 38 provides an output that is compared to expected results to determine whether read circuit 24 and sense circuit 36 are functioning properly or improperly. Selecting second resistor 28 tests read circuit 24 and sense circuit 36 at a resistance value, which is close to the expected high resistance value of memory cells 30 in array 22.

During calibration of read circuit 24, steering circuit 34 selects first resistor 26 and second resistor 28 to provide calibration currents to sense circuit 36. The steering circuit 34 is controlled to select first resistor 26 to calibrate the sense circuit 36 at a low resistance value. The first voltage source 52 provides a calibration voltage to first resistor 26 to provide a calibration current to sense circuit 36. The sense circuit 36 is calibrated around the provided calibration current to optimize detecting low resistance values of memory cells 30. Next, the steering circuit 34 selects second resistor 28 to calibrate the sense circuit 36 at a high resistance value. The second voltage source 54 provides a calibration voltage to second resistor 28 and a calibration current to sense circuit 36. The sense circuit 36 is calibrated around the calibration current provided through second resistor 28 to optimize detecting high resistance values in memory cells 30. In another calibration, steering circuit 34 does not select the first or second resistors 26 and 28, or a bit line 42a–42c. Instead, the sense circuit 36 calibrates the offset voltage of sense circuit 36 without being provided a calibration current from steering circuit 34. First and second resistors 26 and 28 can also be used to determine reference values for distinguishing between the low and high resistive states of memory cells 30.

In one embodiment, first resistor 26 and second resistor 28 are reference resistors that provide reference signals to read circuit 24. The steering circuit 34 selects first resistor 26. First voltage source 52 provides a reference voltage to first resistor 26. The first resistor reference signal is provided to sense circuit 36. The sense circuit 36 provides a reference output signal to comparator 38. The threshold voltage for the comparator is digitally altered to determine the magnitude of the output from sense circuit 36. The value of the output from sense circuit 36 can be stored as a reference value for the low resistive state. Next, the steering circuit 34 selects second resistor 28. Second voltage source 54 provides a reference voltage to second resistor 28. The second resistor reference signal is provided to sense circuit 36. The sense circuit 36 provides a reference output signal to comparator 38. The threshold voltage for comparator 38 is digitally altered to determine the value of the output from sense circuit 36. The value of the output from sense circuit 36 is stored as the reference value for the high resistive state. In practice, a midway point between the low resistive state reference value and high resistive state reference value can be chosen as the threshold value for comparator 38. In other embodiments, the absolute output value from the sense circuit 36 for a selected memory cell 30 can be determined by digitally altering the threshold voltage of comparator 38. The output value for the selected memory cell 30 can be compared to the low resistive state reference value and the high resistive state reference value to determine the state of the selected memory cell 30.

In practice, the read circuit is functionally tested and calibrated to ensure that resistance values are accurately obtained from the first and second resistors 26 and 28, and memory cells 30. Low and high resistive state reference values are obtained and the midway point is calculated to determine the threshold value for comparator 38. After reference values have been obtained, memory cells 30 in memory device 20 are individually tested and the results mapped to mapping areas in memory device 20.

Figure 2:
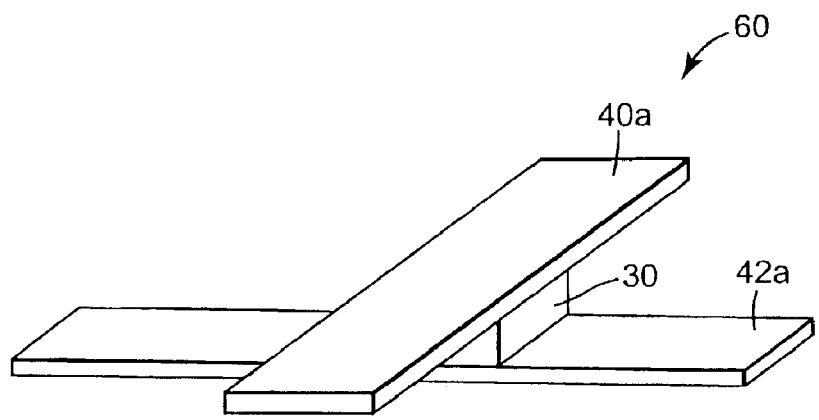
FIG. 2 is a diagram illustrating an exemplary embodiment of an array section.

FIG. 2 is a diagram illustrating an exemplary embodiment of an array section, indicated at 60. Array section 60 includes a word line 40a, memory cell 30 and a bit line 42a. Memory cell 30 is located between word line 40a and bit line 42a. In the exemplary embodiment, word line 40a and bit line 42a are orthogonal to one another. In other embodiments, word line 40a and bit line 42a can lie in other suitable angular relationships to one another.

In the exemplary embodiment, word line 40a and bit line 42a are electrically coupled to read circuit 24 and the write circuit. The write circuit provides write currents to word line 40a and bit line 42a to create magnetic fields, according to the right hand rule, around the word line 40a and bit line 42a and in memory cell 30. The magnetic fields combine to set or switch the state of memory cell 30. The read circuit 24 provides a voltage on word line 40a and a sense current through word line 40a and memory cell 30 to bit line 42a. The steering circuit 34 steers the sense current from the bit line 42a to the sense circuit 36. The magnitude of the sense current indicates the resistive state of memory cell 30. The sense circuit 36 provides an output signal indicative of the magnitude of the sense current to comparator 38. The output of comparator 38 indicates the resistive state of memory cell 30.

In an alternative embodiment, the sense circuit provides a constant voltage on bit line 42a and a sense current through bit line 42a and memory cell 30 to word line 40a. Word line 40a is electrically coupled to ground through the row decode circuit 32. The magnitude of the sense current through memory cell 30 corresponds to the resistive state of memory cell 30. The sense current is provided by a sense circuit. The sense circuit senses the magnitude of the sense current and provides an output signal to a comparator. The comparator indicates the resistive state of the memory cell 30.

Figure 3:
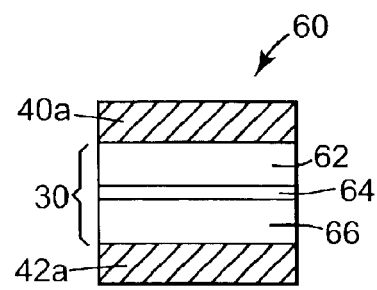
FIG. 3 is a diagram illustrating a cross section of the exemplary embodiment of an array section.

FIG. 3 is a diagram illustrating a cross section of the exemplary embodiment of array section 60. The array section 60 includes memory cell 30 located between word line 40a and bit line 42a. Memory cell 30 includes a sense layer 62, a spacer layer 64 and a reference layer 66. The spacer layer 64 is located between the sense layer 62 and the reference layer 66. The sense layer 62 has an alterable orientation of magnetization and the reference layer 66 has a pinned orientation of magnetization. In this embodiment, the memory cell 30 is a spin tunneling device, with the spacer layer 64 being an insulating barrier layer through which an electrical charge migrates during read operations. Electrical charge migrations through the spacer layer 64 occur in response to a sense current being provided through memory cell 30. In an alternative embodiment, a GMR structure can be used for memory cell 30 and the spacer layer 64 is a conductor, such as copper.

Figure 4:
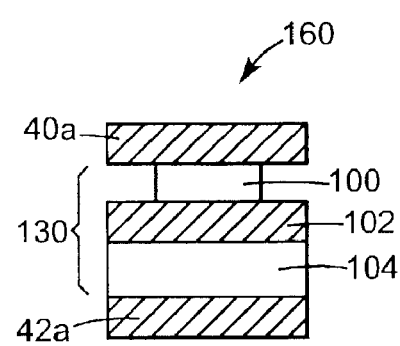
FIG. 4 is a diagram illustrating a cross section of another exemplary embodiment of an array section.

FIG. 4 is a diagram illustrating a cross section of another exemplary embodiment of an array section, indicated at 160. Array section 160 includes an anti-fuse memory cell 130, which is used in place of magnetic memory cell 30 in array 22. The anti-fuse memory cell 130 includes two resistive states. The resistance through anti-fuse memory cell 130 in at least one resistive state is different than the resistance through memory cell 30. The read circuit 24 and resistance values for the first and second resistors 26 and 28 are adjusted to accommodate anti-fuse memory cell 130. In addition, a different write circuit is provided to write the anti-fuse memory cell 130.

Array section 160 includes word line 40a, bit line 42a and a data storage portion, referred to herein as anti-fuse memory cell 130. The memory cell 130 is located between word line 40a and bit line 42a. Memory cell 130 includes a memory storage element 100, an intermediate conductor 102 and a control element 104. The intermediate conductor 102 is located between storage element 100 and control element 104. The storage element 100 is located next to word line 40a, and the control element 104 is located next to bit line 42a.

Memory storage element 100 is configured as a change-of-state storage element, and control element 104 is configured to control current flow through memory cell 130. Storage element 100 is configured to predictably and reliably break down at a lower energy level than control element 104. The resistance through storage element 100 differs based on whether or not storage element 100 has been broken down. The resistance is highest when storage element 100 is not broken down, and lowest after storage element 100 has been broken down. In the high resistive state, the resistance can range from one to ten Megaohms. In the low resistive state the resistance can range from 500 to 1000 ohms. The resistive state of memory cell 130 is read by sensing the resistance through memory cell 130. Read circuit 24 and other read circuits described herein are adapted to read the resistive state of memory cell 130.

In the exemplary embodiment, storage element 100 and control element 104 are tunnel junction devices. Storage element 100 includes an effective cross-sectional area through which current flows that is smaller than the effective cross-sectional area through which current flows in control element 104. Storage element 100 breaks down at lower current levels relative to control element 104 due to the smaller cross-sectional area of storage element 100. To write memory cell 130, current is passed through word line 40a and memory cell 130 to bit line 42a. The write circuit provides current through memory cell 130 to write or break down storage element 100, without breaking down control element 104. The resistance through memory cell 130 changes by a resistance value, such as one to ten Megaohms, in response to breaking down storage element 100.

In other embodiments, storage element 100 and control element 104 are not the same type of device. Also, storage element 100 and control element 104 can have cross-sectional areas that are about equal. In this configuration, the write circuit is configured to break down storage element 100 and ensure that control element 104 sustains operation as a control element for memory cell 130.

In the exemplary embodiment, storage element 100 is a one time programmable tunnel junction device, which is a type of anti-fuse device. The tunnel junction can be formed from oxidized metal, thermally grown oxide, or deposited oxides or nitrides. In other embodiments, storage element 100 can be embodied in other materials and device types, such as polysilicon, amorphous silicon, microcrystalline silicon, metal filament electro-migration, trap induced hysteresis, ferroelectric capacitor, Hall effect, or a read/writable phase-change material including a write-erase-write phase-change material. Memory storage element 100 can also comprise a PIN diode or a Schottky diode.

In the exemplary embodiment, control element 104 is a tunnel junction device. The tunnel junction can be formed from oxidize metal, thermally grown oxide, or deposited oxides or nitrides. In other embodiments, control element 104 can be a diode, such as a PN diode, PIN diode, Schottky diode, Zener diode, avalanche diode, tunnel diode, and a four layer diode device, such as a silicon controlled rectifier. Also, control element 104 can be a junction field effect transistor or a bi-polar transistor. Control element 104 is sized sufficiently to carry a current such that the state of storage element 100 can be changed and the control clement 104 sustains operation as a control element for memory cell 130.

During a write operation, word line 40a and bit line 42a are selected by the write circuit to write memory cell 130. The write circuit provides a write current through word line 40a and memory cell 130 to bit line 42a. The write current flows through storage element 100, intermediate conductor 102 and control element 104. The magnitude of the write current is large enough to break down storage element 100. However, the magnitude of the write current is not large enough to break down control element 104. During a read operation, read circuit 24 selects word line 40a and bit line 42a to sense the resistance through memory cell 130.

Memory devices including write circuits and memory cells similar to memory cell 130 are disclosed and described in U.S. patent application Ser. No. 10/236,274, entitled "Methods And Memory Structures Using Tunnel-Junction Device As Control Element, filed on Sep. 6, 2002, which is incorporated herein by reference, and which is a continuation-in-part of co-pending and commonly assigned U.S. patent application Ser. No. 10/116,497, filed Apr. 2, 2002, which is incorporated herein by reference.

Figure 5:
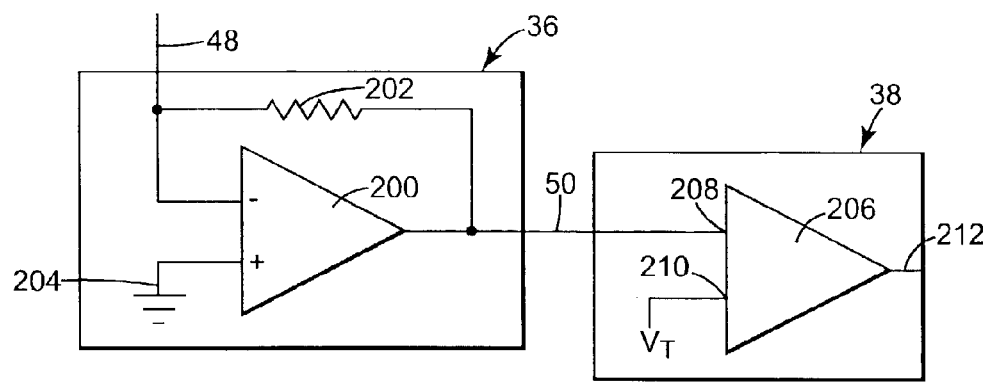
FIG. 5 is a diagram illustrating an exemplary embodiment of a sense circuit and a comparator.

FIG. 5 is a diagram illustrating an exemplary embodiment of a sense circuit 36 and a comparator 38. The sense circuit 36 is electrically coupled to the steering circuit 34 through sense conductor 48, and to comparator 38 through comparator conductor 50. The sense circuit 36 is a current sense amplifier configured to sense the sense current received from steering circuit 34.

The sense circuit 36 is an operational amplifier 200 and a sense resistor 202. The non-inverting input of the operational amplifier is electrically coupled to a reference potential, such as ground, indicated at 204. The inverting input of the operational amplifier 200 is electrically coupled to sense resistor 202 and steering circuit 34 through sense conductor 48. The output of the operational amplifier 200 is electrically coupled to the other end of sense resistor 202 and comparator 38 through comparator conductor 50.

The comparator 38 includes a comparator circuit 206 that includes a first input 208, a second input 210 and a comparator output 212. The first input 208 is electrically coupled to the output of operational amplifier 200 and sense resistor 202 through comparator conductor 50. The second input 210 is electrically coupled to a threshold voltage source, indicated at $V_T$. The comparator output 212 is electrically coupled to circuits, such as an output register, for storing high and low output signal levels provided by comparator circuit 206.

The threshold voltage source $V_T$ is a digital voltage source provided with memory device 20. Digital inputs are received by memory device 20 from a controller to adjust the voltage level of threshold voltage source $V_T$. In another embodiment, the threshold voltage source $V_T$ can be an internally fixed voltage or the voltage source $V_T$ can be provided by an external source and brought into memory device 20 through an external pin.

The sense circuit 36 receives a sense current from steering circuit 34 and provides an output signal to comparator 38. The magnitude of the output signal corresponds to the magnitude of the received sense current. The comparator 38 receives the output signal from sense circuit 36 and compares the received output signal to the voltage level provided by threshold voltage source $V_T$. The comparator provides logical high and low signal levels at comparator output 212.

During testing of sense circuit 36, the steering circuit 34 selects the first resistor 26 and then the second resistor 28. In the exemplary embodiment, the first resistor 26 has a resistance value, which corresponds to the expected resistance value of a memory cell 30/130 in a low resistive state. The second resistor 28 has a resistance value, which corresponds to the expected resistance value of a memory cell 30/130 in a high resistive state. In other embodiments, the first resistor 26 and second resistor 28 can be any resistance value, including a resistance value midway between the expected high and low resistance values of memory cells 30/130.

To begin testing, the steering circuit 34 selects first resistor 26 and first voltage source 52 provides test patterns to the first resistor 26. The test patterns include digital waveforms with various duty cycles and ramped waveforms to test the dynamic response of sense circuit 36. First resistor 26 is tied to the virtual ground of operational amplifier 200 through steering circuit 34. A sense current is provided through first resistor 26 to sense circuit 36. The sense current is a function of the resistance through first resistor 26 and the voltage provided by first voltage source 52.

The sense current is received by sense circuit 36. The sense circuit 36 provides an output signal to comparator circuit 206. The comparator circuit 206 compares the received output signal to the voltage provided by threshold voltage source $V_T$ and provides corresponding high and low logic outputs. The logic outputs are compared to expected results to determine whether the sense circuit 36 is functioning properly. The voltage provided by threshold voltage source $V_T$ can be adjusted to switch the output of comparator circuit 206 at different input voltage levels. Switching the output of comparator circuit 206 at different input voltage levels, can be used to determine the output signal level provided by operational amplifier 200. This process continues until all test patterns are exhausted.

Next, the steering circuit 34 selects second resistor 28 and second voltage source 54 provides test patterns to the second resistor 28. The comparator circuit 206 provides high and low logic outputs in response to output signals from the operational amplifier 200. The voltage provided by threshold voltage source $V_T$ can be adjusted to switch the output of comparator circuit 206 at different input voltage levels. Switching the output of comparator circuit 206 at different input voltage levels, can be used to determine the output signal level provided by operational amplifier 200. This process continues until all test patterns are exhausted.

To calibrate the sense circuit 36, the steering circuit 34 selects the first resistor 26 and then the second resistor 28. In one calibration, the steering circuit 34 does not select any memory cells 30/130, the first resistor 26 or the second resistor 28. Instead, steering circuit 34 selects a ground and provides a ground signal to the inverting input of operational amplifier 200. The sense circuit 36 calibrates an offset voltage using the ground signal. Calibration continues with first resistor 26.

Steering circuit 34 selects first resistor 26 and first voltage source 52 provides a calibration voltage to the first resistor 26. The sense circuit 36 and operational amplifier 200 are calibrated based on the calibration sense current received from first resistor 26. Next, the steering circuit 34 selects second resistor 28 and second voltage source 54 provides a calibration voltage to second resistor 26. The sense circuit 36 and operational amplifier 200 are further calibrated based on the calibration sense current received from second resistor 28. During calibration, the voltage provided by threshold voltage source $V_T$ can be digitally altered to obtain precise values for calibration.

The threshold voltage provided by threshold voltage source $V_T$ is set at a reference voltage value to distinguish between the high and low resistive states of memory cells 30/130. To determine the optimum reference voltage, the steering circuit 34 selects the first resistor 26 and then the second resistor 28. The first voltage source 52 provides a reference voltage to the first resistor 26 to obtain a low resistive state threshold voltage. The reference sense current through first resistor 26 is received by sense circuit 36. Sense circuit 36 provides an output signal to comparator circuit 206. The threshold voltage provided by threshold voltage source $V_T$ is digitally adjusted to determine the output signal level received from operational amplifier 200 and the low resistive state threshold voltage value. The low resistive state threshold voltage value is stored.

Next, steering circuit 34 selects second resistor 28 and second voltage source 54 provides a reference voltage to second resistor 28 to obtain a high resistive state threshold voltage. The sense current through second resistor 28 is received by sense circuit 36. The sense circuit 36 provides an output signal to comparator circuit 206. The threshold voltage provided by threshold voltage source $V_T$ is adjusted to determine the output signal level received from operational amplifier 200 and the high resistive state threshold voltage value. The high resistive state threshold voltage value is stored. The reference voltage value is calculated as the midway point between the low and high threshold voltage values. This reference voltage value is used by threshold voltage source $V_T$ during read operations.

During a read operation, the row decode circuit 32 selects a word line 40a–40c and the steering circuit 34 selects a bit line 42a–42c. The row decode circuit 32 provides a source voltage to the selected word line 40a–40c, and the steering circuit 34 couples the selected bit line 42a–42c to the virtual ground of operational amplifier 200. A sense current is provided through the selected memory cell 30 to sense circuit 36. The sense circuit 36 provides an output signal to comparator circuit 206. The comparator circuit 206 distinguishes between the high and low resistive states of memory cell 30 by comparing the received output signal to the reference voltage value provided by the threshold voltage source $V_T$. In one MRAM configuration, the memory device 20 maps out the good and bad memory cells 30 before the memory device 20 is used in a system.

Circuits and methods for sensing the resistive states of memory cells, such as memory cells 30/130, and for calibrating sense circuits are disclosed and described in U.S. Pat. No. 6,259,644, entitled "Equipotential Sense Methods For Resistive Crosspoint Memory Cell Arrays," issued to Tran et al. on Jul. 10, 2001, which is incorporated herein by reference, and U.S. Pat. No. 6,262,625, entitled "Operational Amplifier With Digital Offset Calibration," issued to Perner et al. on Jul. 17, 2001, which is incorporated herein by reference.

Figure 6:
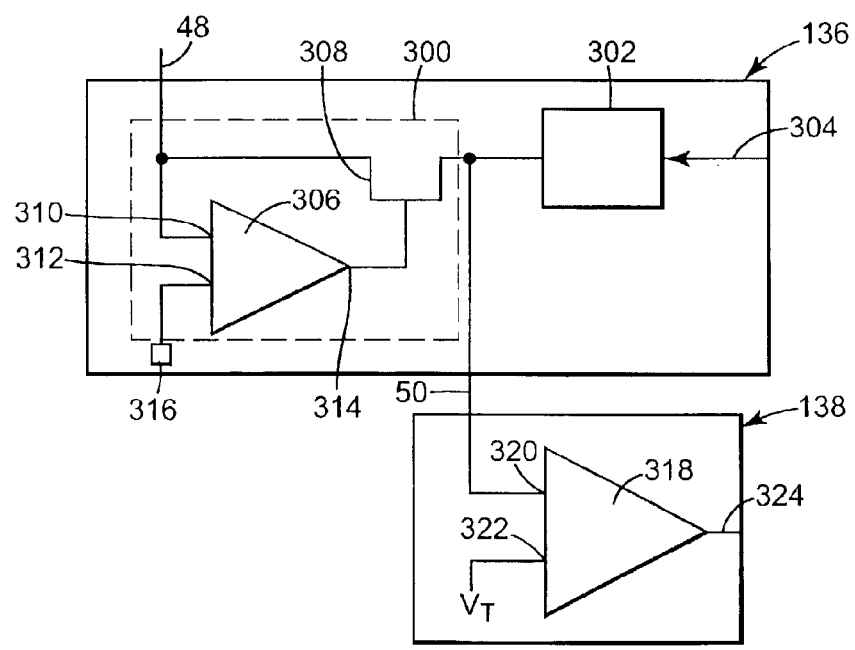
FIG. 6 is a diagram illustrating another exemplary embodiment of a sense circuit and a comparator.

FIG. 6 is a diagram illustrating another exemplary embodiment of a sense circuit 136 and a comparator 138. Sense circuit 136 and comparator 138 are used in place of sense circuit 36 and comparator 38 in read circuit 24 and memory device 20. Sense circuit 136 is electrically coupled to steering circuit 34 through sense conductor 48. Sense circuit 136 is electrically coupled to comparator 138 through comparator conductor 50.

The sense circuit 136 includes a direct injection charge amplifier 300 and a current source 302. The charge amplifier 300 is electrically coupled to current source 302 and comparator 138 through comparator conductor 50. Current source 302 provides a source current to charge amplifier 300. The magnitude of the source current is controlled by a source voltage provided at 304. In the exemplary embodiment, the source voltage is provided by a voltage source, which is part of memory device 20. The voltage source is configured to provide test patterns and receive digital input values from a controller to provide constant voltages. In the exemplary embodiment, the current source 302 includes resistors, similar to first resistor 26 and second resistor 28.

The charge amplifier 300 includes an operational amplifier 306 and a feedback loop including field effect transistor 308. The operational amplifier 306 includes a first input 310, a second input 312 and an output 314. The first input 310 is electrically coupled to steering circuit 34 and field effect transistor 308 through sense conductor 48. The second input 312 is electrically coupled to a sense voltage source, indicated at 316. The output 314 is electrically coupled to the gate of field effect transistor 308. The drain to source path through field effect transistor 308 is electrically coupled between sense conductor 48 and comparator conductor 50.

The comparator 138 includes a comparator circuit 318 including a first input 320, a second input 322 and an output 324. The first input 320 is electrically coupled to current source 302 and field effect transistor 308 through comparator conductor 50. The second input 322 is electrically coupled to threshold voltage source $V_T$. The output 324 is electrically coupled to circuitry, such as an output register, for storing high and low level signals provided by comparator circuit 318.

In the exemplary embodiment, threshold voltage source $V_T$ is a digital voltage source, which is part of memory device 20. The digital voltage source receives digital input values from a controller to adjust the voltage provided by threshold voltage source $V_T$. In another embodiment, the threshold voltage source $V_T$ can be an internal fixed voltage source or an external voltage source provided through an external pin.

Sense circuit 136 provides a regulated, constant voltage through sense conductor 48 to steering circuit 34. The voltage provided through sense conductor 48 is essentially equal to the voltage provided by sense voltage source 316 at second input 312. This is due to the virtual short between first input 310 and second input 312. The current source 302 provides a current, referred to as the source current, to charge amplifier 300 and field effect transistor 308. The charge amplifier 300 provides a current, referred to as the sense current, to sense conductor 48 and steering circuit 34. The steering circuit 34 provides the sense current to the selected bit line 42a–42c, first resistor 26 or second resistor 28. The selected word line 40a–40c, first resistor 26 or second resistor 28 is coupled to ground to complete the circuit.

The voltage on comparator conductor 50 is high or low depending on the relative magnitudes of the sense current and the source current. The voltage on comparator conductor 50 is high in the event the source current is greater than the sense current and low in the event the source current is less than the sense current. The comparator 318 compares the voltage on comparator conductor 50 to the voltage provided by threshold voltage source $V_T$ and provides a logic high or low output at comparator output 324.

The first resistor 26 and second resistor 28 are used to test sense circuit 136, calibrate sense circuit 136 and determine a source voltage at 304 and a threshold voltage at 322 for reading memory cells 30/130. In the exemplary embodiment, the first resistor 26 has a low resistance value, which corresponds to the expected low resistance value of a memory cell 30/130 in a low resistive state. The second resistor 28 has a high resistance value, which corresponds to the expected high resistance value of a memory cell 30/130 in a high resistive state. In other embodiments, first resistor 26 and second resistor 28 can be any resistance value, including a resistance value midway between the expected high and low resistance values of memory cells 30/130.

To test sense circuit 136, steering circuit 34 selects first resistor 26 and first voltage source 52 couples the first resistor 26 to ground. The sense voltage source 316 provides a sense voltage to second input 312 of operational amplifier 306. This voltage is provided through sense conductor 48 to first resistor 26. A corresponding constant current is produced through first resistor 26. A source voltage test pattern is provided at 304 to current source 302. The current source 302 provides a corresponding source current test pattern to charge amplifier 300. The voltage on comparator conductor 50 changes as the source current changes. The test patterns include digital waveforms with various duty cycles, and ramped waveforms to test the dynamic response of sense circuit 136.

The comparator circuit 318 receives the voltage provided on comparator conductor 50 and compares the received voltage to the threshold voltage provided by threshold voltage source $V_T$. The threshold voltage is digitally altered to acquire precise measurements of the voltage on comparator conductor 50. The comparator 318 provides high and low logic output signals at comparator output 324.

Next, steering circuit 34 selects second resistor 28 and second voltage source 54 couples second resistor 28 to ground. A constant sense current is provided through second resistor 28 and test patterns are provided at 304 to current source 302. The voltage on comparator conductor 50 changes as the source current changes. The comparator 318 provides high and low logic output signals in response to the changing voltage on comparator conductor 50. The threshold voltage is digitally altered to take precise measurements of the voltage on comparator conductor 50.

In an alternative method of testing sense circuit 136, the voltage source at 304 provides a constant voltage and a constant source current is provided by current source 302 to charge amplifier 300. The test patterns are provided by first voltage source 52 to first resistor 26 and second voltage source 54 to second resistor 28. The threshold voltage is digitally altered at comparator input 322 to obtain precise measurements of the voltage on comparator conductor 50.

To calibrate sense circuit 136, steering circuit 34 selects first resistor 26 and first voltage source 52 couples first resistor 26 to ground. Sense voltage source 316 provides a sense voltage to second input 312 of operational amplifier 306. A constant source voltage is provided at 304 to current source 302. The current source 302 provides a constant current to charge amplifier 300. The sense circuit 136 and charge amplifier 300 are calibrated. Next, steering circuit 34 selects second resistor 28 and second voltage source 54 couples second resistor 28 to ground. The sense circuit 136 and charge amplifier 300 are further calibrated.

In another calibration, the steering circuit 34 does not select any memory cells 30/130, the first resistor 26 or the second resistor 28. Instead, the steering circuit 34 selects an open signal for sense conductor 48 and provides the open signal to the first input 310 of operational amplifier 306. The sense circuit offset voltage is calibrated.

A reference source voltage value is obtained for the source voltage at 304 to read memory cells 30/130. To obtain the reference source voltage value, steering circuit 34 selects first resistor 26 and first voltage source 52 couples first resistor 26 to ground. A predetermined sense voltage, which is provided during a read operation, is provided by the sense voltage source 316 to second input 312 of operational amplifier 306. This sense voltage is provided across first resistor 26 by charge amplifier 300. The threshold voltage source $V_T$ provides a threshold voltage, which falls midway between the high and low voltage levels on comparator conductor 50. The high and low voltage levels on comparator conductor 50 are determined during testing of sense circuit 136. The source voltage at 304 is digitally adjusted until a transition occurs on comparator conductor 50. The comparator circuit 318 provides high and low logic signals to indicate a transition on comparator conductor 50. The source voltage value provided at 304 is stored as a first source voltage value.

Next, steering circuit 34 selects second resistor 28 and second voltage source 54 couples the second resistor 28 to ground. The predetermined sense voltage, which is provided during a read operation, is provided by the sense voltage source 316 to second input 312 of operational amplifier 306. This sense voltage is provided across second resistor 28 by charge amplifier 300. The threshold voltage source $V_T$ provides the threshold voltage, which falls midway between the high and low voltage levels on comparator conductor 50. The source voltage at 304 is digitally adjusted until a transition occurs on comparator conductor 50. The comparator circuit 318 provides high and low logic signals to indicate a transition on comparator conductor 50. The source voltage value provided at 304 is stored in memory as a second source voltage value. The reference source voltage value is the midway point between the first and second stored source voltage values. The reference source voltage value is provided at 304 to distinguish between the high and low resistive states of memory cells 30/130 during a read operation.

During a read operation, row decode circuit 32 selects a word line 40a–40c and steering circuit 34 selects a bit line 42a–42c. The row decode circuit 32 couples the selected word line 40a–40c to ground. The steering circuit 34 couples the selected bit line 42a–42c to sense conductor 48 and sense circuit 136. The sense voltage source 316 provides a sense voltage to operational amplifier 306 and the reference source voltage is provided at 304 to current source 302. The voltage on comparator conductor 50 is provided to comparator circuit 318. The comparator circuit 318 provides a high or low logic signal to distinguish between high and low resistive states of the selected memory cell 30/130. In one MRAM configuration, memory device 20 maps functional and non-functional memory cells 30.

Circuits and methods for sensing the resistive states of memory cells, such as memory cells 30/130, and for calibrating sense circuits are disclosed and described in U.S. Pat. Nos. 6,259,644 and 6,262,625, previously incorporated by reference in this specification.

Figure 7:
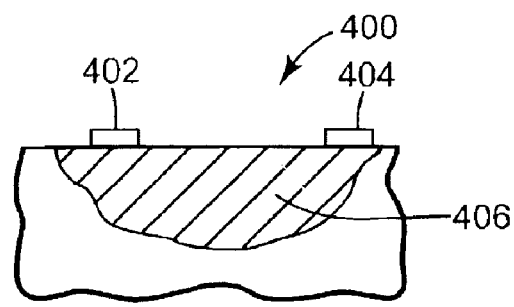
FIG. 7 is a diagram illustrating an exemplary embodiment of an N well diffusion resistor.

FIG. 7 is a diagram illustrating an exemplary embodiment of an N well diffusion resistor 400, which can be used as first resistor 26 or second resistor 28. The resistor 400 includes a first contact 402, a second contact 404 and an N well, indicated at 406. The N well 406 is a highly doped N plus diffusion region, which provides a linear resistance characteristic between the first and second contacts 402 and 404. The N well diffusion resistor 400 has a resistance per square characteristic in the one hundred ohms per square range. The N well diffusion resistor 400 is a CMOS process compatible resistor.

The first contact 402 is electrically coupled to a voltage source and the second contact 404 is electrically coupled to steering circuit 34, or vice-versa. Sense currents flow through the resistor 400 from the first contact 402 to the second contact 404, or vice-versa. The sense currents are for testing the sense circuits 36/136, calibrating the sense circuits 36/136 and obtaining reference voltage values. The N well diffusion resistor 400 provides a linear resistance characteristic across operational temperatures and voltages.

Figure 8:
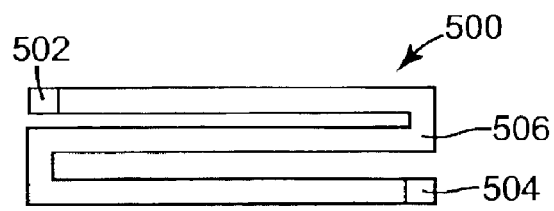
FIG. 8 is a diagram illustrating an exemplary embodiment of a polysilicon resistor.

FIG. 8 is a diagram illustrating an exemplary embodiment of a polysilicon resistor 500, which can be used as first resistor 26 or second resistor 28. The polysilicon resistor 500 includes a first contact 502, a second contact 504 and a resistor body, indicated at 506. The resistor body 506 can be configured to wind from first contact 502 to second contact 504 to save space on the memory device 20.

Polysilicon resistor 500 is made from undoped polysilicon, which has a resistance value per square in the ten thousand ohms per square range. Very large resistance values can be obtained using undoped polysilicon in a small number of squares. In another embodiment, doped polysilicon resistors can be used. Doped polysilicon resistors have a resistance per square value in the one hundred to one thousand ohms per square range.

The first contact 502 is electrically coupled to a voltage source and the second contact 504 is electrically coupled to steering circuit 34, or vice-versa. Sense currents flow through the resistor 500 from first contact 502 to second contact 504, or vice-versa. The sense currents are for testing the sense circuits 36/136, calibrating the sense circuits 36/136 and obtaining reference voltage values.

In other embodiments of suitable resistors for first resistor 26 and second resistor 28, the resistors can be analog linear resistors or tuned resistors to provide accurate resistance values. Resistors can be tuned by annealing the resistive material to achieve a specific resistance value. Also, resistors can be tuned by laser trimming the resistors to fine tune the number of squares and resistance values. In addition, a resistor array including fuses can be provided on memory device 20. In this configuration, the resistance value is tuned by burning or programming the fuses. In one embodiment, the fuses are reprogrammable and the resistor array can be dynamically tuned to compensate for process, temperature and voltage values.

In another embodiment, first and second resistors 26 and 28 are provided external to the integrated circuit chip including memory array 22, read circuit 24 and the write circuit. The off chip resistors can be thin film high precision resistors, such as one percent precision resistors and metal thin film resistors.

Figure 9:
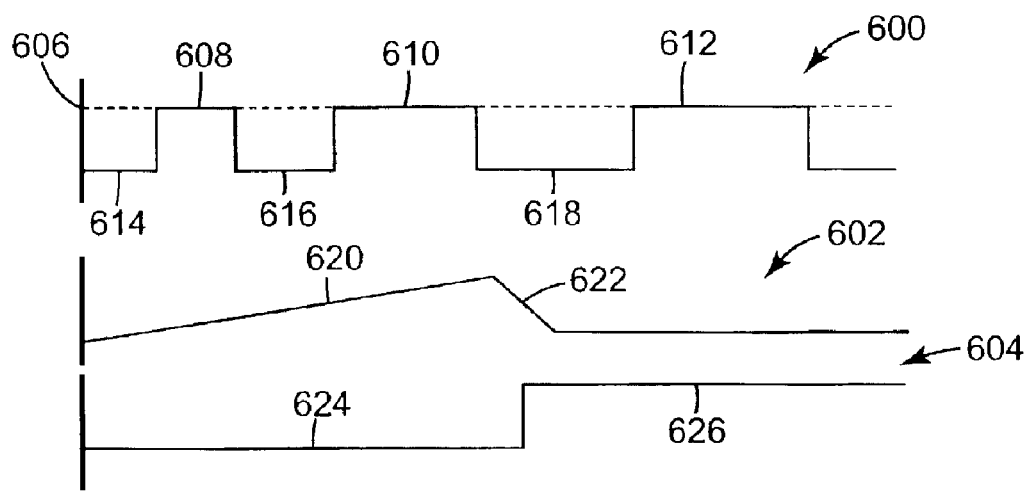
FIG. 9 is a diagram illustrating exemplary test patterns and an exemplary reference voltage waveform.

FIG. 9 is a diagram illustrating exemplary test patterns at 600 and 602, and an exemplary reference voltage waveform at 604. The digital waveform test pattern at 600 is provided to first and second resistors 26 and 28 or sense circuit 136 to test the functionality of sense circuits 36/136 and comparators 38/138. The digital test pattern 600 includes a fixed magnitude signal, indicated at 606 including duty cycles and periods that change. In the exemplary digital test pattern 600, the first pulse 608 is shorter in length than the second pulse 610 and the second pulse 610 is shorter in length than the third pulse 612. The time between pulses, indicated at 614, 616 and 618 also changes.

In operation, digital test pattern 600 is provided to memory device 20 to test sense circuits 36/136. Comparators 38/138 provide outputs indicating changes in the digital test pattern 600. A controller is configured to receive output signals from the comparators 38/138, measure the time between changes and compare the measured result to expected test results.

The ramped waveform test pattern 602 includes a slowly ramping section, indicated at 620, and a rapidly ramping section, indicated at 622. The ramped test pattern 602 is provided to first and second resistors 26 and 28 or sense circuit 136 to test the dynamic response of sense circuits 36/136. The ramped test pattern 602 tests the sense circuits 36/136 response to particular rise and fall times of input sense currents.

The reference voltage waveform 604 includes a constant low level voltage 624 and a constant high level voltage 626. The reference voltage waveform 604 is provided to first and second resistors 26 and 28 or sense circuit 136 to calibrate sense circuits 36/136 and read memory cells 30/130. The reference voltage waveform 604 provides a constant voltage to provide constant sense currents, reference currents and threshold voltages to calibrate sense circuits 36/136 and read memory cells 30/130.

The memory device 20 includes first and second resistors 26 and 28 that provide similar resistance values from device to device. The first and second resistors 26 and 28 are suitable for testing and calibrating sense circuits 36/136. In addition, first and second resistors 26 and 28 can be used to obtain reference values for distinguishing between high and low resistive states of memory cells 30/130. The sense circuits 36/136 are tested independently of memory cells 30/130 and in MRAM embodiments functional and non-functional memory cells 30 can be mapped.

What is claimed is:

1. A memory device, comprising:
    an array of memory cells configured to provide resistive states;
    a read circuit configured to sense the resistive states; and
    a resistor configured to provide a resistance to the read circuit that is configured to select the resistor and sense the resistance to test the read circuit.

2. The memory device of claim 1, wherein the read circuit is configured to receive a digital test pattern and provide an output signal indicating a change in the digital test pattern.

3. The memory device of claim 1, wherein the read circuit is configured to receive a ramped waveform and provide an output signal indicating dynamic response of the read circuit.

4. The memory device of claim 1, wherein the read circuit is configured to receive a calibration signal and provide an output signal indicating calibration changes in the read circuit.

5. The memory device of claim 1, wherein the read circuit is configured to receive a reference signal and provide an output signal indicating the resistive states of the memory cells.

6. The memory device of claim 1, wherein the read circuit is configured to select the resistor and sense the resistance to test functionality of the read circuit.

7. The memory device of claim 1, wherein the read circuit is configured to select the resistor and sense the resistance to calibrate the read circuit.

8. The memory device of claim 1, wherein the read circuit is configured to select the resistor and sense the resistance to determine a reference signal value for distinguishing the resistive states of the memory cells.

9. The memory device of claim 1, wherein the resistor is an N well diffusion resistor.

10. The memory device of claim 1, wherein the resistor is a polysilicon resistor.

11. The memory device of claim 1, wherein the resistor is tuned to provide a resistance value.

12. The memory device of claim 1, wherein the resistor is a resistor array configured with fuses for tuning the resistance value.

13. The memory device of claim 1, wherein the resistor is laser trimmed to tune the resistance value.

14. The memory device of claim 1, wherein the array of memory cells is an MRAM array of magnetic memory cells.

15. The memory device of claim 1, wherein the array of memory cells is an anti-fuse array of memory cells.

16. The memory device of claim 1, wherein the array of memory cells is part of an integrated circuit chip and the resistor is part of the integrated circuit chip.

17. The memory device of claim 1, wherein the array of memory cells is part of an integrated circuit chip and the resistor is located outside the integrated circuit chip.

18. The memory device of claim 17, wherein the resistor is a metal thin film resistor.

19. The memory device of claim 17, wherein the resistor is a 1% precision resistor.

20. A memory device, comprising:
    a memory cell configured to provide a first resistive state and a second resistive state;
    means for sensing the first resistive state and the second resistive state;
    means for providing a first resistance to the means for sensing; and
    means for providing a second resistance to the means for sensing, wherein the means for providing a first resistance corresponds to the first resistive state and the means for providing a second resistance corresponds to the second resistive state.

21. The memory device of claim 20, wherein the means for sensing is configured to receive a functional test pattern and provide an output signal corresponding to the functional test pattern.

22. The memory device of claim 21, wherein the functional test pattern is a digital test pattern.

23. The memory device of claim 20, wherein the means for sensing is configured to receive a dynamic response test waveform and provide an output signal indicating dynamic responses of the means for sensing.

24. The memory device of claim 23, wherein the dynamic response test waveform is a ramped waveform.

25. The memory device of claim 20, wherein the means for sensing is configured to receive a calibration signal and provide an output signal to indicate calibration changes in the means for sensing.

26. The memory device of claim 20, wherein the means for providing a first resistance and the second means for providing a second resistance are used to obtain a reference signal for distinguishing the first resistive state and the second resistive state of the memory cell.

27. The memory device of claim 20, wherein the means for providing a first resistance and the means for providing a second resistance are tuned to provide resistance values to the means for sensing.

28. A method of testing a magnetic memory device comprising an array of magnetic memory cells, the method comprising:

providing a read circuit in the magnetic memory device;

providing a resistor that differs structurally from magnetic memory cells in the array of magnetic memory cells;

sensing the resistance through the resistor with the read circuit to obtain a result; and comparing the result to expected results.

29. The method of claim 28, wherein providing the resistor comprises providing an N-well that is highly doped to provide a linear resistance characteristic.

30. The method of claim 28, wherein providing the resistor comprises providing a winding resistor body to conserve space and achieve a resistance value.

31. The method of claim 28, wherein sensing the resistance comprises applying a functional test pattern to the read circuit that provides a corresponding output signal.

32. The method of claim 28, wherein sensing the resistance comprises applying a dynamic response test waveform to the read circuit that responds with the dynamic response of the read circuit.

33. The method of claim 28, further comprising, sensing the resistance through the resistor to obtain a reference signal for distinguishing resistive states of the magnetic memory cells;

applying the reference signal to the read circuit; and obtaining resistive states of the magnetic memory cells.

* * * * *

UNITED STATES PATENT AND TRADEMARK OFFICE
CERTIFICATE OF CORRECTION

| | |
|---|---|
| PATENT NO. | : 6,873,543 B2 |
| APPLICATION NO. | : 10/448574 |
| DATED | : March 29, 2005 |
| INVENTOR(S) | : Kenneth Kay Smith et al. |

It is certified that error appears in the above-identified patent and that said Letters Patent is hereby corrected as shown below:

On the Title Page, Item (75), in "Inventors", delete "Andrew VanBrocklin" and insert -- Andrew Van Brocklin --, therefor.

Signed and Sealed this

Twenty-seventh Day of October, 2009

David J. Kappos
*Director of the United States Patent and Trademark Office*